United States Patent
Roeder et al.

[11] Patent Number: 6,137,440
[45] Date of Patent: Oct. 24, 2000

[54] MICROWAVE ACTIVE SOLID STATE COLD/WARM NOISE SOURCE

[75] Inventors: Robert S. Roeder, Dunedin; Matthew C. Smith, Largo, both of Fla.

[73] Assignee: Raytheon Company, Lexington, Mass.

[21] Appl. No.: 08/963,962

[22] Filed: Nov. 4, 1997

Related U.S. Application Data

[60] Provisional application No. 60/032,290, Dec. 3, 1996.

[51] Int. Cl.[7] .................................................. G01S 3/02
[52] U.S. Cl. ........................................ 342/351; 342/174
[58] Field of Search .................................. 342/351, 174

[56] References Cited

U.S. PATENT DOCUMENTS

| | | | |
|---|---|---|---|
| 3,235,731 | 2/1966 | Seling | 342/351 X |
| 3,263,230 | 7/1966 | Greenberg | 342/351 |
| 3,380,055 | 4/1968 | Fow et al. | 342/351 |
| 3,409,827 | 11/1968 | Goggings, Jr. . | |
| 3,525,037 | 8/1970 | Madden, et al . | |
| 3,564,420 | 2/1971 | Webb | 342/351 X |
| 3,628,151 | 12/1971 | Roeder | 342/351 |
| 3,638,494 | 2/1972 | Broussaud et al. | 73/355 R |
| 3,693,095 | 2/1972 | Wilt . | |
| 3,735,405 | 5/1973 | Berg | 343/100 ME |
| 3,737,905 | 6/1973 | Haroules et al. | 342/351 |
| 3,748,904 | 7/1973 | Ford | 342/351 |
| 3,777,270 | 12/1973 | Hardy, et al. . | |
| 4,081,679 | 3/1978 | Cohn | 342/351 |
| 4,272,731 | 6/1981 | Day, et al. . | |
| 4,527,162 | 7/1985 | Strickland | 342/351 |
| 4,568,200 | 2/1986 | Hatono et al. | 342/351 |
| 5,047,783 | 9/1991 | Hugenin | 342/351 |
| 5,128,884 | 7/1992 | Prager . | |
| 5,231,404 | 7/1993 | Gasiewski | 342/351 |
| 5,270,528 | 12/1993 | Ogikubo . | |
| 5,354,325 | 10/1994 | Chive, et al . . | |
| 5,688,050 | 11/1997 | Sterzer, et al. . | |

OTHER PUBLICATIONS

"A Table–Based Bias and Temperature–Department Small–Signal and Noise Equivalent Circuit Model ", Peter B. Winson, Steven M. Lardizabal and Lawrence Dunleavy, *IEEE Transactions on Microware Theory and Techniques*, vol. 45, No. 1, Jan. 1997, pp. 46–51.

"The United Kingdom National Standard of Microware Noise at 4–1 GHz and 77K", D.J. Blundell, *Journal of Physics Scientific Instruments*, 1975 vol. 8.

*Primary Examiner*—Mark Hellner
*Attorney, Agent, or Firm*—Baker & Botts, L.L.P.

[57] ABSTRACT

A microwave active noise source and method used for calibrating a radiometer includes a transistor configured as a noise equivalent model having a gate port, drain port and source port. During calibration of the radiometer the drain port is terminated and a bias circuit applies DC bias to the noise equivalent model. The bias circuit controls the DC bias such that a hot thermal radiation temperature and a cold thermal radiation temperature are alternately generated at the gate port of the noise equivalent model. A source inductance coupled to the source port of the noise equivalent model provides series feedback. To match the impedances in the noise source, an output matching impedance network is connected to the drain port and an input matching impedance network is connected to the gate port of the noise equivalent model. The input matching impedance network includes an input port for outputting the hot and cold thermal radiation temperatures used to calibrate the radiometer.

20 Claims, 6 Drawing Sheets

BIAS CONTROLLED NOISE TEMPERATURE

FIG. 9

MICROWAVE ACTIVE SOLID STATE COLD/WARM NOISE SOURCE

This application claims the benefit of U.S. Provisional Application No. 60/032,290 filed on Dec. 3, 1996.

TECHNICAL FIELD

The present invention relates to calibration of a radiometer with reference temperatures from a noise source and, more particularly, to calibration of a radiometer with reference temperatures from a microwave active solid state noise source providing hot and cold reference noise temperatures.

BACKGROUND OF THE INVENTION

Radiometers are used to measure thermal radiation or brightness temperatures emitted from a segment of a remote object. The segment is commonly referred to as a scene and may be a portion of the earth's surface. Like most sophisticated instrumentation, radiometers require periodic calibration to insure accurate measurements. In practice, at least two known calibration temperatures, which bound the brightness temperatures of the scene, are used to calibrate a radiometer receiver. The lowest and highest calibration temperatures are referred to as cold and hot thermal radiation temperatures, respectively.

Radiometers are generally ground-based, airborne or satellite-based systems that measure brightness temperatures in the range of 10° K–300° K. The ground-based system may utilize closed cycle refrigeration such as a sterling cycle cooler with liquid nitrogen or liquid helium to generate cold thermal radiation temperatures "Tc". The closed cycle refrigeration systems are not considered practical for the satellite-based systems.

Figure 1:
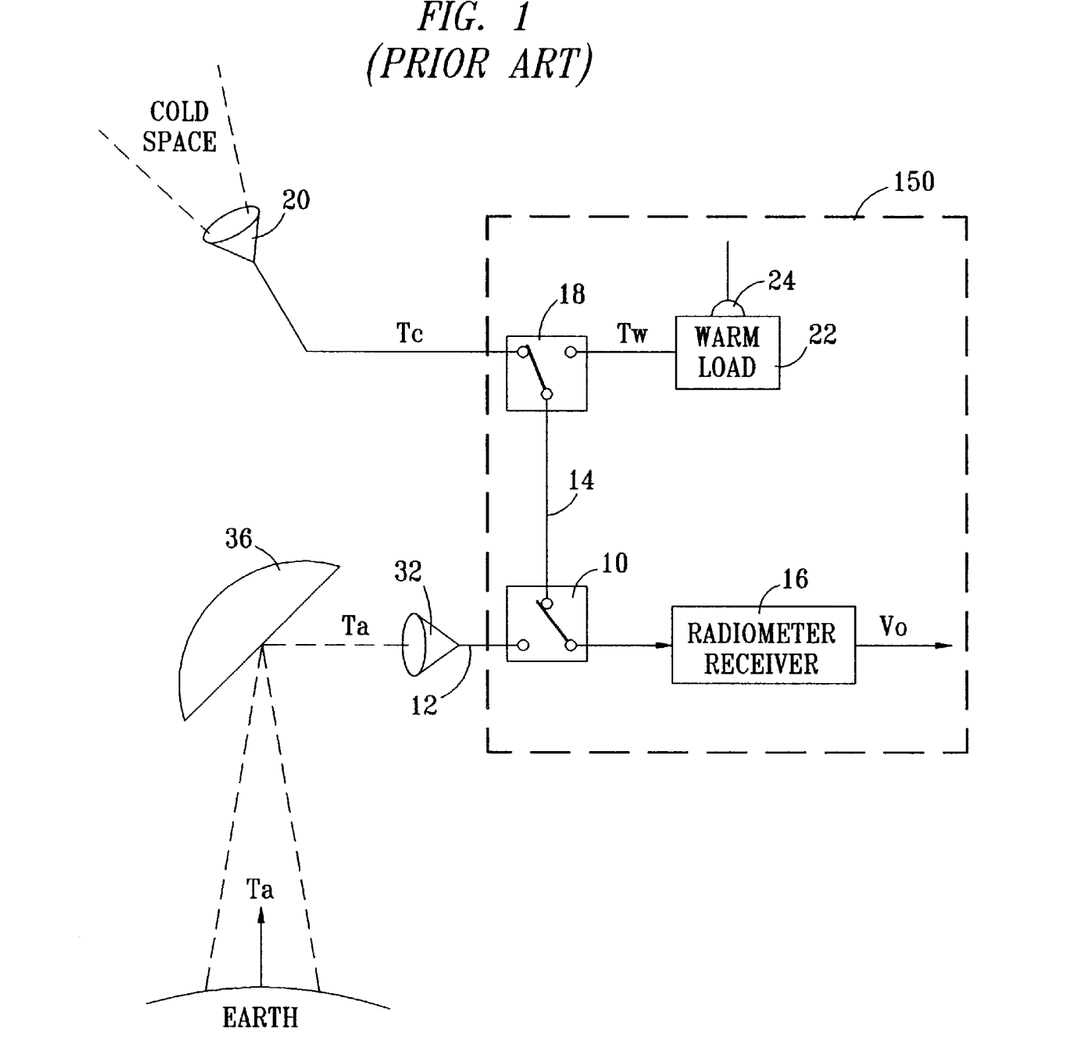
FIG. 1 is a schematic representation of PRIOR ART illustrating a sky horn approach for calibrating a satellite-based radiometer.
Figure 2:
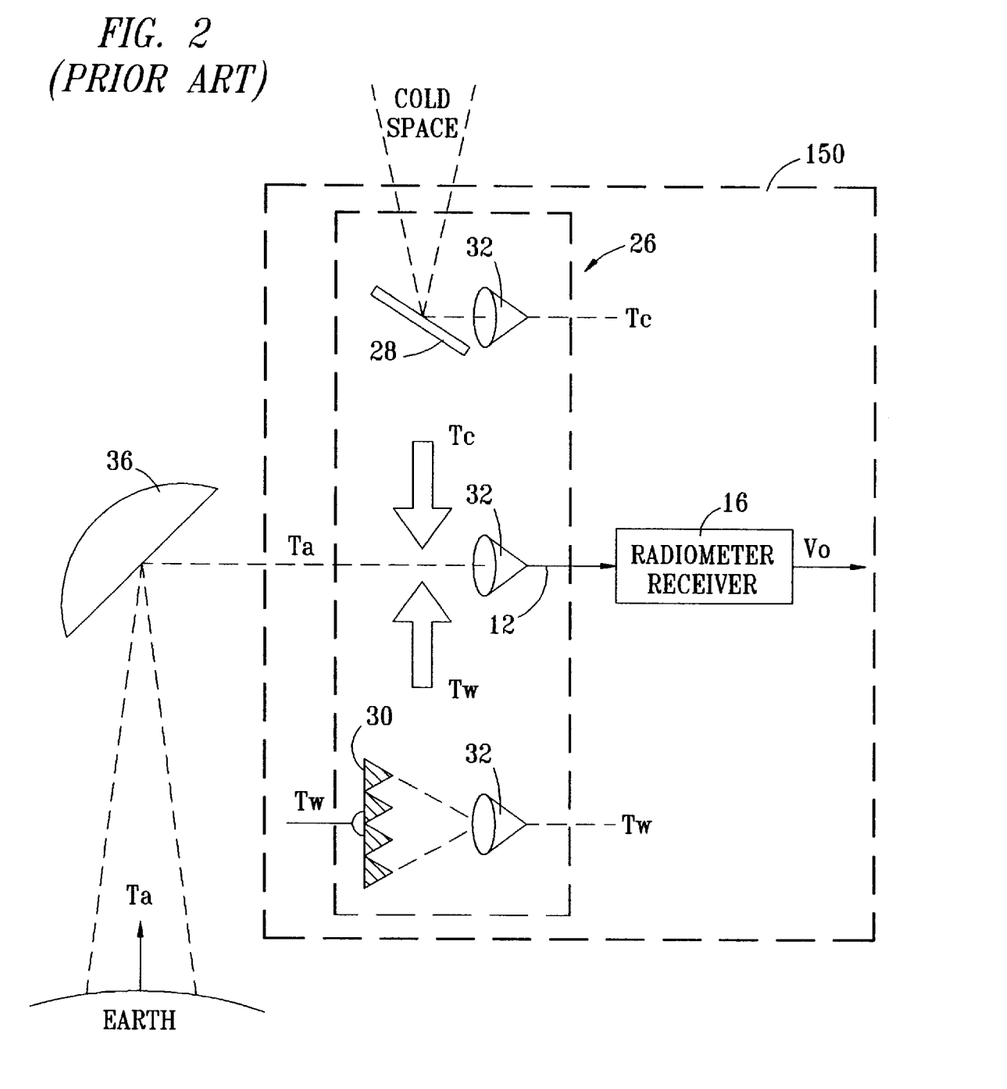
FIG. 2 is a schematic representation of PRIOR ART illustrating a calibration technique using an antenna scanner.
Figure 3:
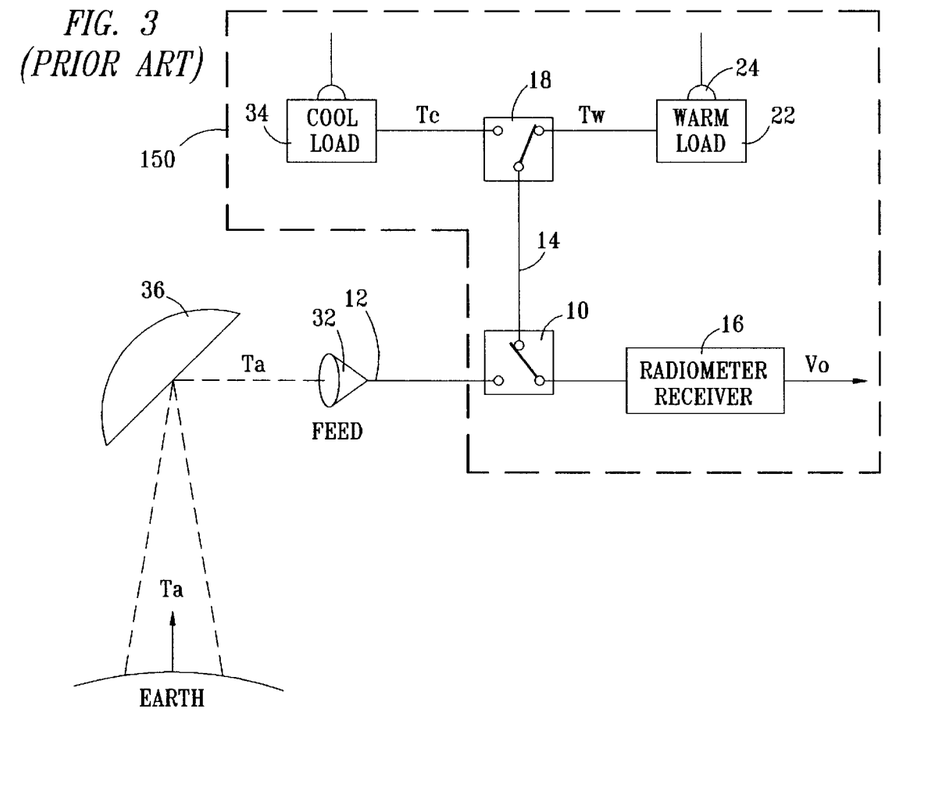
FIG. 3 is a schematic representation of PRIOR ART illustrating an internally-based calibration technique using a thermo-electric cooler.

Referring to FIGS. 1–3, there are illustrated three traditional satellite-based systems for measuring the brightness temperature "Ta" emitted from a portion of the earth's surface and received by an antenna 36. The brightness temperature "Ta" is then transmitted through an antenna feed 32 on an antenna-earth scene line 12 to a radiometer receiver 16 of the radiometer system 150. Currently, satellite-based systems use calibration techniques that are either externally-based (FIGS. 1 and 2) or internally-based (FIG. 3).

Referring to FIG. 1, there is illustrated an externally-based calibration technique known as the sky horn approach. The sky horn approach utilizes a radiometer system 150 which includes a first RF switch 10 that connects either the antenna-earth scene line 12 or a calibration line 14 to the radiometer receiver 16. In the calibration line 14 a second RF switch 18 alternately switches between a sky horn 20 and an internal warm load 22. The sky horn 20 outputs the cold space thermal radiation temperature "Tc," approximately 2.7° K, and the internal warm load 22 generates a hot thermal radiation temperature "Tw," approximately 300° K. A precision thermistor 24 in thermal contact with the warm load 22 outputs an electrical hot thermal radiation temperature "Td" that is equivalent to the hot thermal radiation temperature "Tw". The electrical hot thermal radiation temperature "Td" is utilized in the calibration of the radiometer receiver 16.

The sky horn approach is a complex and expensive way to calibrate the radiometer receiver 16. The main problem is that the antenna-earth scene line 12 and calibration line 14 are separate lines, thereby requiring precise knowledge of the RF losses, mismatch losses and physical temperatures of each line to accurately calibrate the radiometer receiver 16. Also, the use of the sky horn 20 adds to the complexity of the calibration, because of possible interference of the sky horn pattern by a spacecraft or contamination caused by the earth or sun.

Referring to FIG. 2, there is illustrated another externally-based calibration technique for satellite-based systems using an antenna scanner 26. The antenna scanner 26 is a mechanical mechanism employed during a calibration mode to alternately couple a reflector plate 28 or an absorption target 30 to respectively feed a cold thermal radiation temperature "Tc" or a hot thermal radiation temperature "Tw" to the antenna feed 32. The antenna feed 32 is connected to the radiometer receiver 16. During an antenna mode when the brightness temperature "Ta" is measured, the antenna scanner 26 connects the antenna-earth scene line 12 to the radiometer receiver 16. The antenna scanner 26 does have an advantage over the sky horn approach in that only one RF path is utilized. However, the antenna scanner 26 is complex, bulky and adds significant size and weight to the radiometer system 150.

Referring to FIG. 3, there is illustrated an internally-based calibration technique that may be used in a satellite-based system. The internal approach is very similar to the sky horn approach discussed previously and illustrated in FIG. 1. However, the internal technique may utilize a thermo-electric cooler 34 to generate a cold thermal radiation temperature "Tc" of approximately 270° K, instead of the sky horn 20 used in the sky horn approach. However, the hot and cold thermal radiation temperatures "Tc" and "Tw" used in the internal approach may only be 30° K apart. The 300° K difference between the cold and hot thermal radiation temperatures "Tc" and "Tw" does not cover the full range of earth brightness temperatures which are approximately 100° K to 300° K, therefore, measurement accuracy of the radiometer receiver 16 will likely degrade below the cold thermal radiation temperature "Tc."

Accordingly, there is a need for a calibration noise source to provide cold and hot thermal radiation temperatures for calibrating a radiometer. There is also a need to provide a noise source that may be manufactured using microwave integrated circuit (MIC) or monolithic microwave integrated circuit (MMIC) technologies. These and other needs are satisfied by the calibration noise source of the present invention.

SUMMARY OF THE INVENTION

The present invention is a radiometer calibration system utilizing a microwave active noise source and a method for calibrating a radiometer. The noise source includes a transistor configured as a noise equivalent model having a gate port, drain port and source port. During calibration of the radiometer the drain port is terminated and a bias circuit applies DC bias to the noise equivalent model. The bias circuit controls the DC bias such that a hot thermal radiation temperature and a cold thermal radiation temperature are alternately output to the gate port of the noise equivalent model. A source inductance coupled to the source port of the noise equivalent model provides series feedback for the noise source. To match impedances to the noise equivalent model, an output matching impedance network is connected to the drain port and an input matching impedance network is connected to the gate port. The input matching impedance network includes an input port for outputting the hot thermal radiation temperature and the cold thermal radiation temperature utilized to calibrate the radiometer.

According to the present invention there is provided a calibration system having a noise source for calibration of ground-based, airborne or satellite-based radiometers.

Also in accordance with the present invention there is provided a noise source that functions in the millimeter and microwave spectrum.

Further in accordance with the present invention there is provided a calibration system having a noise source implemented as an integrated circuit.

Further in accordance with the present invention there is provided a calibration system having a noise source with a built-in-test capability providing noise figure measurements.

In accordance with the present invention there is also provided a radiometer having adjustable calibration time intervals to maximize the measurements of earth scenes.

BRIEF DESCRIPTION OF THE DRAWINGS

A more complete understanding of the invention may be had by reference to the following Detailed Description when taken in conjunction with the accompanying Drawings wherein.

DETAILED DESCRIPTION OF THE DRAWINGS

Figure 4:
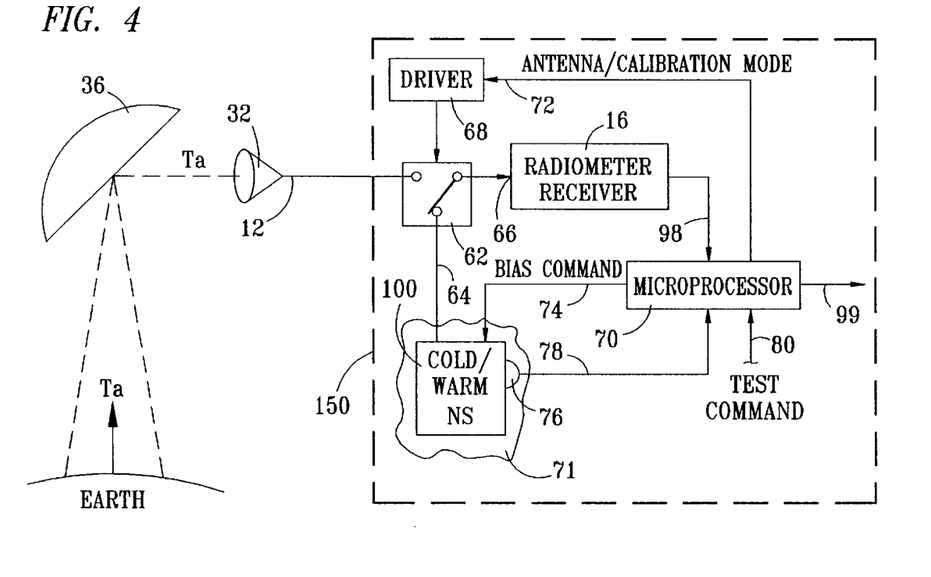
FIG. 4 is a schematic representation of the present invention illustrating a satellite-based radiometer calibration system incorporating a noise source.

Referring to FIG. 4 there is disclosed a noise source 100 for calibration of a radiometer in accordance with the present invention.

Although the noise source 100 will be described incorporated with a radiometer calibration system 150, those skilled in the art will appreciate that such application is only one of many for utilizing the noise source of the present invention. Accordingly, the described noise source 100 should not be construed in a limiting manner.

Major contributing errors associated with calibrating satellite-based radiometers arise from the following factors: (1) cold calibration brightness temperature; (2) warm calibration brightness temperature; (3) radiometer receiver transfer function; (4) ground retrieval algorithm; and (5) antenna brightness temperature. Each of the major contributing errors must be separately addressed and combined in establishing an overall accuracy scheme for the radiometer calibration system 150. The errors associated with the cold and warm calibration brightness temperatures are addressed by the noise source 100. A detailed description of the noise source 100 will be discussed after describing the interaction of the noise source with the radiometer calibration system 150.

Referring to FIG. 4, there is illustrated a schematic representation of the satellite-based radiometer calibration system 150 incorporating the noise source 100. The brightness temperature "Ta" emitted from a segment of the earth's surface is received by the antenna reflector 36 and transmitted to the antenna feed 32. The antenna feed 32 outputs the brightness temperature "Ta" on the antenna-earth scene line 12. The antenna-earth scene line 12 is connected to a selector switch 62 for switching either the antenna earth scene line 12 or a calibration line 64 to an input terminal 66 of the radiometer receiver 16. The calibration line 64 connects the noise source 100 to the radiometer receiver 16. The selector switch 62 is preferably a low loss RF ferrite switch.

A driver 68 actuates and controls the selector switch 62 according to commands received from a microprocessor 70. Initially, the microprocessor 70 receives a "test command" signal from an external source (not shown) on line 80; the test command triggers the calibration sequence.

Figure 6A:
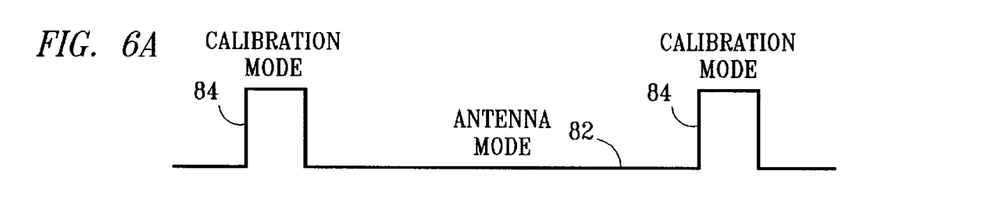
FIGS. 6A and 6B are illustrations of calibration and bias commands transmitted by a microprocessor to the driver and the noise source, respectively, illustrated in FIG. 4.
Figure 6B:
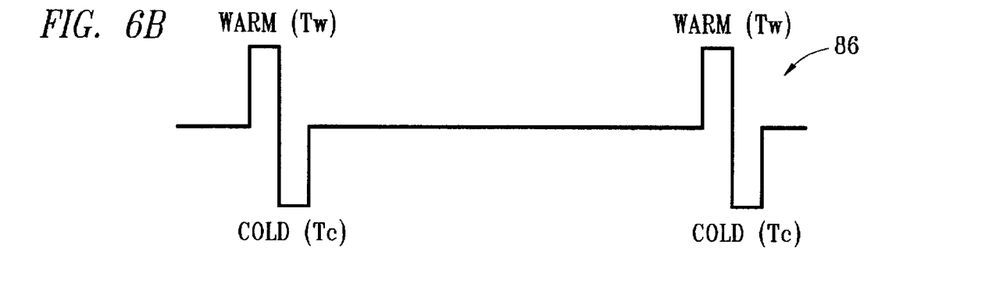

Referring to FIGS. 4, 6A and 6B, the microprocessor 70 transmits a command on line 72 to the driver 68 to actuate either an antenna mode 82 or calibration mode 84 (FIG. 6A). In the antenna mode 82 the selector switch 62 is actuated to connect the antenna-earth scene line 12 to the input terminal 66 of the radiometer receiver 16. In the calibration mode 84 the selector switch 62 is actuated to connect the calibration line 64 to the input terminal 66 of the radiometer receiver 16. Selection of the calibration mode 84 at selected time intervals for short durations maximizes measurements of the brightness temperatures "Ta".

The microprocessor 70 also transmits a bias command signal 86 (FIG. 6B) on line 74 to the noise source 100. The noise source 100, responsive to the bias command signal, alternately outputs the cold thermal radiation temperature "Tc" and the hot thermal radiation temperature "Tw". Alternating between the hot and cold thermal radiation temperatures "Tc", "Tw" occurs during the calibration mode 84. The noise source 100 does not output the cold thermal radiation temperature "Tc" or the hot thermal radiation temperature "Tw" during the antenna mode 82.

Referring again to FIG. 4, the noise source 100 includes a correction precision thermistor 76 in thermal contact with the noise source and connected to the microprocessor 70 by a line 78. The correction precision thermistor 76 provides compensation for changes in the physical temperature "Td" of the noise source 100. A thermal insulation blanket 71 may be provided to encompass the noise source 100. The compensation, DC bias, and the correction precision thermistor 76 are elements of the noise source 100 and will be discussed in greater detail later.

Prior to using the radiometer calibration systems 150, the noise source 100 is initially calibrated with a laboratory radiometer (not shown). During the initial calibration of the radiometer calibration system 150 there is generated a series of reference calibration curves which are stored in the microprocessor 70. The calibration curves are accessed by the microprocessor 70 during the calibration mode 84 to adjust the uncorrected output voltage from the radiometer receiver 16 on line 98 to the corrected output voltage on line 99. Referring to FIGS. 5A, 5B, 5C, and 5D, the calibration curves include a precision thermistor calibration curve 88, a noise source radiation temperature drift curve 90, a radiometer calibration curve 92 and a corrected radiometer calibration curve 94.

The precision thermistor curve 88 (FIG. 5A) illustrates the change in the voltage "Vd" versus the temperature "Td" of the noise source 100 sensed along signal line 78. "VD" is a calibrated thermistor output voltage corresponding to the known physical temperature "Td".

Figure 5A:
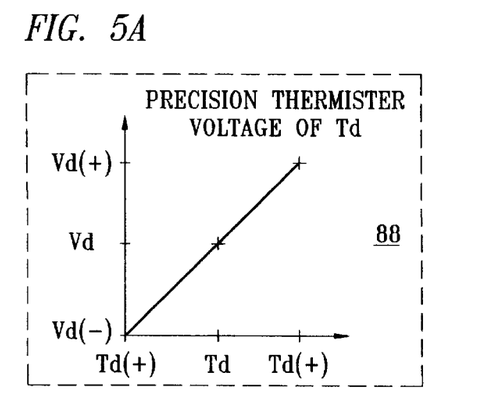
FIGS. 5A–5D illustrate calibration curves for use with the present radiometer calibration system.
Figure 5B:
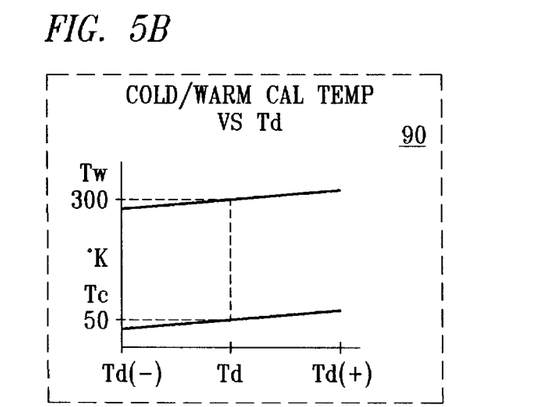
Figure 5C:
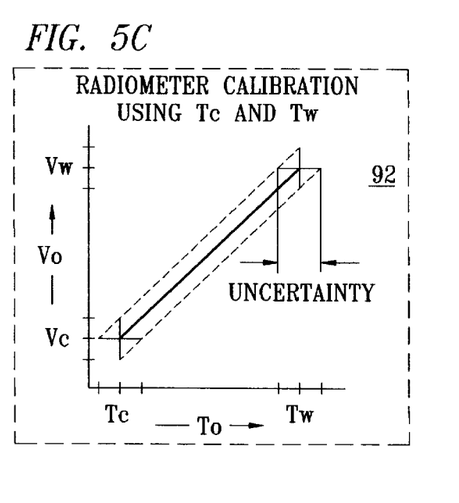
Figure 5D:
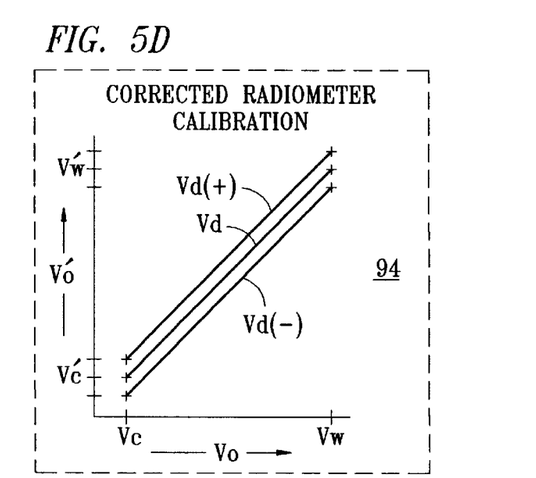

The noise source radiation temperature drift curve 90 (FIG. 5B) sensed along line 64 and radiometer calibration curve 92 (FIG. 5C) sensed along line 98 are combined into the corrected radiometer calibration curve 94 (FIG. 5D). The corrected radiometer calibration curve 94 represents the amount of correction required of the uncorrected output voltage generated by the radiometer receiver 16 on line 98 and input to the microprocessor 70. The radiometer calibration curve 92 (FIG. 5C) illustrates the radiometer calibration performed during the calibration mode 84. The uncertainty is due to the variation in the physical temperature "Td" of the noise source 100. The microprocessor 70 utilizing data represented by the precision thermistor curve 88 adjusts the uncorrected output voltage to generate a corrected output voltage on line 99. The corrected output voltage represents the correct output by taking into consideration the physical temperature "Td" of the noise source 100. The shift in the calibration curves 88, 90, 92 and 94 have been exaggerated to illustrate the correction procedures of the radiometer calibration system 150. The data represented by the calibration curves 88, 90, 92, and 94 have been utilized to calibrate the output signal of the radiometer receiver 16 when operating in the antenna mode 82.

Figure 7:
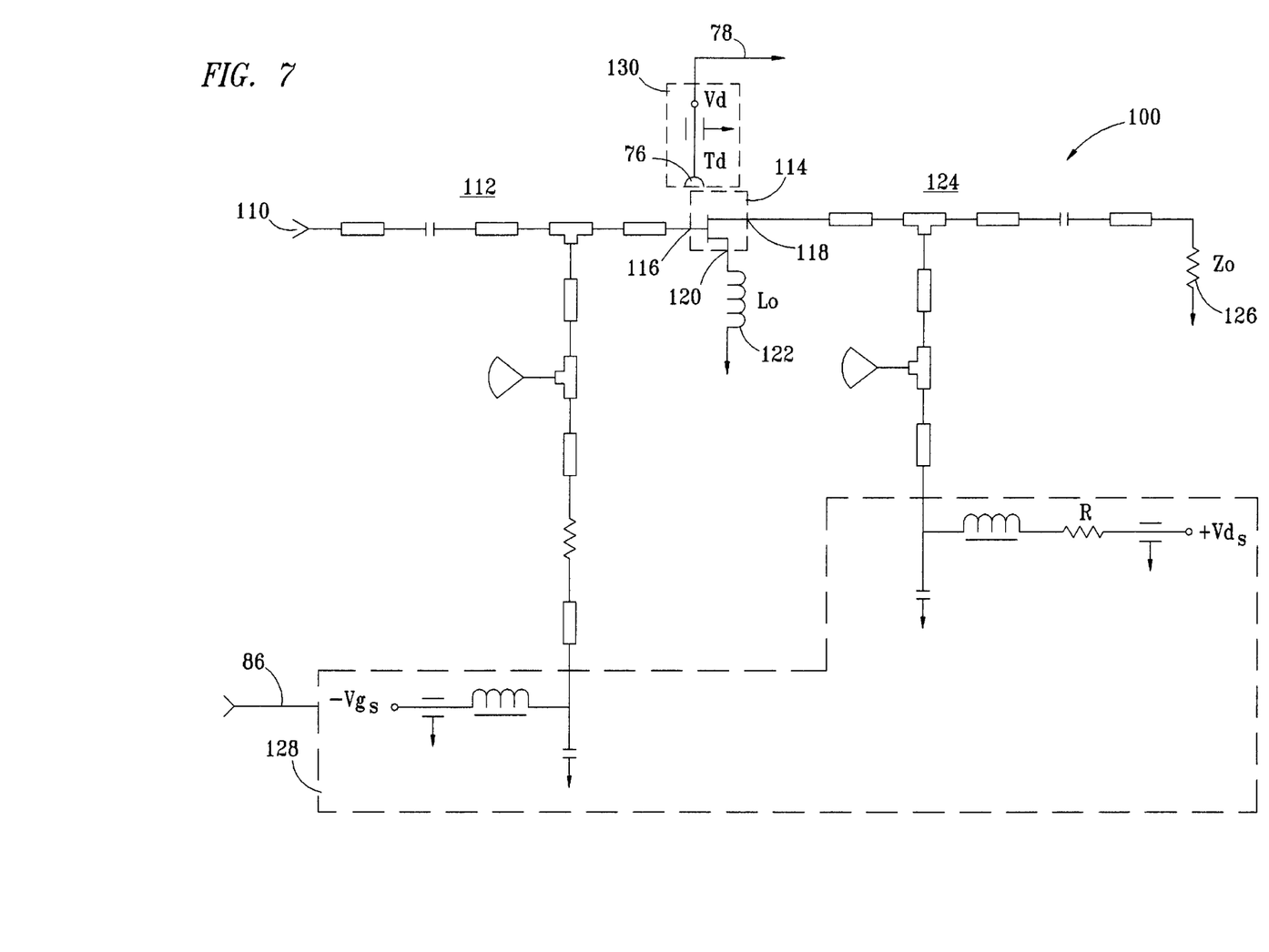
FIG. 7 is a simplified schematic of a microwave active solid state cold/hot noise source implemented as a microwave integrated circuit.

Referring to FIG. 7, there is illustrated a simplified schematic of the active solid state cold/hot noise source 100 implemented as a microwave integrated circuit. The microwave integrated circuit utilizes either microwave integrated circuit (MIC) or monolithic microwave integrated circuit (MMIC) technologies. The noise source 100 is designed to operate in the microwave and millimeter wave spectrum having a frequency range of 18–40 GHz.

The noise source 100 includes an input port 110 where the hot thermal radiation temperature "Tw" and the cold thermal radiation temperature "Tc" are reflected to the calibration line 64 (FIG. 4) and applied to the radiometer receiver 16 (FIG. 4) during the calibration mode 84. The input port 110 is an element of an input matching impedance network 112 which includes a plurality of input transmission lines configured and sized to match the impedances of the input port and a noise equivalent model 114. The plurality of input transmission lines are preferably manufactured with $Al_2O_3$ and are approximately 0.015" thick. The input matching impedance network 112 is connected to a gate port 116 of the noise equivalent model 114.

The noise equivalent model 114 is a microwave active circuit designed to simulate noise temperatures such as the hot and cold thermal radiation temperatures "Tw" and "Tc" when DC bias is applied. A report regarding the simulation of noise temperatures using a model was presented at the 1995 IEEE International Microwave Symposium by P. B. Winson, S. M. Landizabal, and L. P. Dunleavy entitled "A Table Based Bias and Temperature Dependent Small Signal and Noise Equivalent Circuit Model."

The term "noise temperature" is an expression for the noise power spectral density at a specified frequency and is derived from Planck's blackbody formula. The average energy of an oscillator at a temperature T is:

$$\langle \epsilon \rangle = \frac{hf}{\exp(hf/kT) - 1} \tag{1}$$

where f is the frequency; h is Planck's constant; and k is the thermal conductivity. At high temperatures and low frequencies $\langle \epsilon \rangle$ approaches kT so the power in a bandwidth B will be P=kTB (Nyquist's formula). A quantity Φ=P/kB is taken as a convenient unit of thermal noise power spectral density and is referred to as "noise temperature."

The noise equivalent model 114 utilizes a field effect transistor (FET) having a drain port 118, a source port 120 and the gate port 116. The drain port 118 is terminated during the operation of the noise source 100. The source port 120 is connected to a source inductance 122 to provide series feedback for the noise source 100, where the source inductance 122 is preferably in the range of 20–700 pH.

A bias circuit 128 generates a DC bias that is applied to the noise source 100, during the calibration mode 84. The microprocessor 70 adjusts the magnitude of the DC bias to change the values of the cold and hot thermal radiation temperatures "Tc" and "Tw". More particularly, the DC bias corresponds to the bias command signal 74 transmitted from the microprocessor 70 (FIG. 4) such that a hot thermal radiation temperature "Tw" and a cold thermal radiation temperature "Tc" are alternately reflected to the gate port 116 of the noise equivalent model 114.

A stabilizing compensation circuit 130 in contact with the noise equivalent model 114 and connected to the microprocessor 70 (FIG. 4) provides further control of the DC bias. The stabilizing circuit 130 includes the precision thermistor 76 and measures the physical temperature "Td" of the noise source 100. If the stabilizing compensation circuit 130 is not used then fluctuations in the physical temperature "Td" of the noise source 100 may adversely effect the performance of the noise source.

An output matching impedance network 124 includes a load 126 and a plurality of output transmission lines configured and sized to match the impedances of the load and the drain port 118 of the noise equivalent model 114. The output matching network 124 is connected to the drain port 118. The plurality of output transmission lines are preferably manufactured from $Al_2O_3$ and are approximately 0.015" thick.

Figure 8:
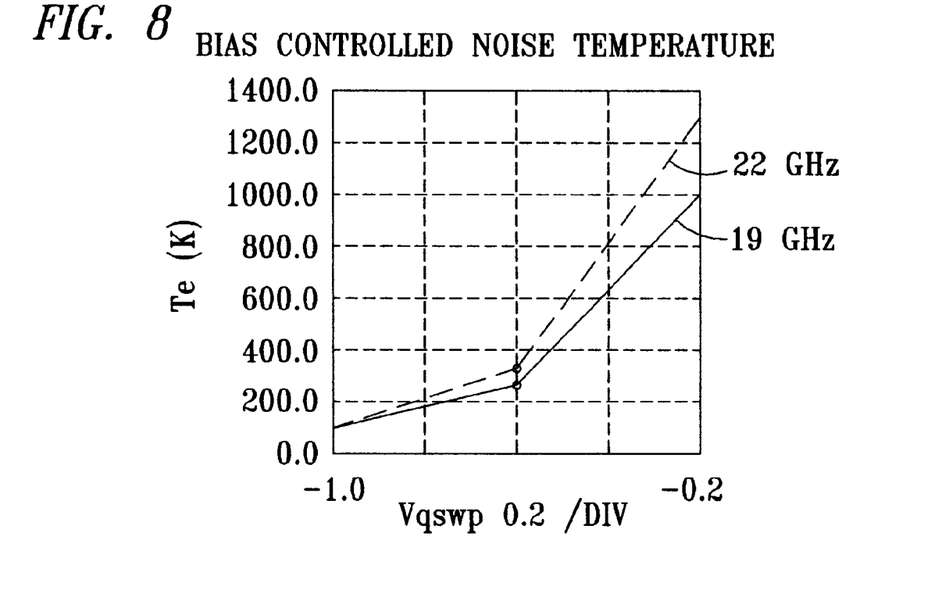
FIG. 8 is a graph of a thermal radiation curve for a noise source operating at 19 GHz and 22 GHz with DC bias applied.

Referring to FIG. 8, there is illustrated a graph of a thermal radiation curve for the noise source 100 operating at 19 GHz and 22 GHz with DC bias. The typical noise temperatures generated by the noise source 100 are in the range of 100° K to 1400° K.

Figure 9:
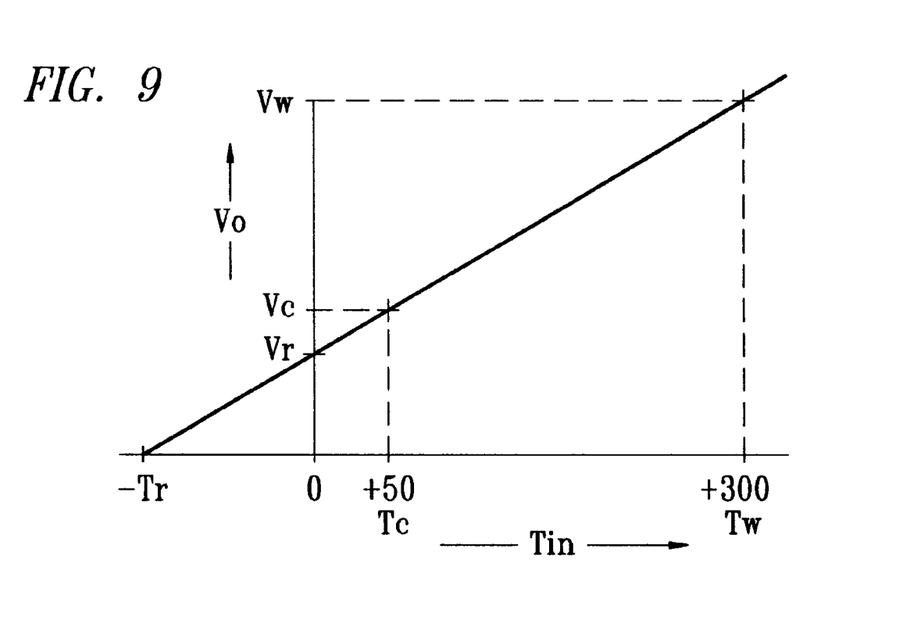
FIG. 9 is a graph illustrating a noise figure measurement of the radiometer receiver illustrated in FIG. 7.

Referring to FIG. 9 there is a graph illustrating a noise figure measurement of the radiometer receiver 16. Noise figure measurement is the process of quantitatively determining the ratio of the total noise power per unit bandwidth at the output of the noise source 100 to the portion of the noise power due to the input termination, at the standard noise temperature of 290° K. The noise figure (F) equation may be represented by the following equation:

$$F = Tr/To + 1 \tag{2}$$

where "Tr" is the receiver noise temperature and "To" represents the temperature of the radiometer receiver 16. "To" is measured using a receiver precision thermistor (not shown) mounted on RF components in the radiometer receiver 16.

The following equations are derived by referring to FIG. 9 and are relevant in calculating the noise figure measurement utilizing a linear radiometer receiver 16 discussed above:

$$\frac{Vo - Vc}{Tin - Tc} = \frac{Vw - Vc}{Tw - Tc}; \quad (3)$$

$$Tin = Tc \text{ or } Tw \text{ applied to the radiometer receiver} \quad (4)$$

For $Tin = 0$ $$Vr - Vc - Tc\left[\frac{Vw - Vc}{Tw - Tc}\right]; \text{ and} \quad (5)$$

$$Tr = Vc\left[\frac{Tw - Tc}{Vw - Vc}\right] - Tc \quad (6)$$

The noise figure is expressed by:

$$F = Tr/To + 1 \text{(where } To \approx 290° \text{ K (ambient))} \quad (7)$$

where "Vc", "Vr" and "Vw" are the radiometer output voltages corresponding to "Tc", "Tr", and "Tw", respectively.

While the present invention has been described with reference to the illustrated embodiment, it is not intended to limit the invention but, on the contrary, it is intended to cover such alternatives, modifications and equivalents as may be included in the spirit and scope of the invention as defined in the following claims.

We claim:

1. An active noise source for calibrating a radiometer, said noise source comprising:
   a noise equivalent circuit having a gate port, drain port and source port;
   a source inductance providing series feedback coupled to the source port of the noise equivalent circuit;
   an output impedance matching network terminated at the drain port of the noise equivalent circuit, said output impedance matching network including a load;
   an input impedance matching network connected to the gate port of the noise equivalent circuit, said input impedance matching network including an input port, said input port reflecting a hot thermal radiation temperature and a cold thermal radiation temperature to calibrate the radiometer; and
   a bias circuit applying DC bias to the output impedance matching network and the input impedance matching network to generate the hot thermal radiation temperature and the cold thermal radiation temperature alternately at the gate port of the noise equivalent circuit.

2. The noise source in accordance with claim 1 further including a microprocessor connected to the bias circuit, said microprocessor generating control signals to adjust the DC bias to establish the hot thermal radiation temperature and the cold thermal radiation temperature.

3. The noise source in accordance with claim 2 further comprising a stabilizing compensation circuit in thermal contact with the noise equivalent circuit and connected to the microprocessor to provide temperature related control of the DC bias.

4. The noise source in accordance with claim 3 wherein the stabilizing compensation circuit further includes a precision thermistor in thermal contact the noise equivalent circuit.

5. The noise source in accordance with claim 1 wherein the noise equivalent circuit comprises a microwave active FET having a DC bias and temperature dependent small signal parameter.

6. The noise source in accordance with claim 5 wherein the noise equivalent circuit operates between 18 GHz and 40 GHz.

7. A radiometer system comprising:
   a radiometer receiver;
   a switch for selecting between an antenna mode and a calibration mode, said antenna mode enabling a brightness temperature received from an antenna to be applied to the radiometer receiver;
   a microwave active noise source connected to the radiometer receiver through said switch when in the calibration mode, said noise source alternately outputting a cold thermal radiation temperature or a hot thermal radiation temperature;
   a driver for controlling the operation of said switch; and
   a microprocessor coupled to the radiometer receiver, the noise source and said driver for correcting the output of said radiometer receiver, said microprocessor storing a series of reference calibration data to be accessed during the calibration mode to adjust the uncorrected output voltage from the radiometer receiver.

8. The radiometer system in accordance with claim 7 wherein the microprocessor further generates a bias command controlling an output from the noise source to alternate between the cold thermal radiation temperature and the hot thermal radiation temperature.

9. The radiometer system in accordance with claim 7 wherein the microprocessor responds to calibration curve signals from the noise source to correct voltage outputs from the radiometer receiver.

10. The radiometer system in accordance with claim 9 wherein said noise source further includes a thermistor in thermal contact with the noise source, said thermistor generates a signal to the microprocessor corresponding to the physical temperature of the noise source.

11. The radiometer system in accordance with claim 10 wherein said microprocessor further includes a memory storing a plurality of reference curves for correcting the voltage outputs from the radiometer receiver.

12. A method for calibrating a radiometer receiver using an active noise source, comprising the steps of:
   transmitting a bias command from a microprocessor to the noise source;
   generating in the noise source a cold thermal radiation temperature or a hot thermal radiation temperature having magnitudes responsive to the bias command;
   coupling the cold thermal radiation temperature or hot thermal radiation temperature to the radiometer receiver;
   alternating the bias command transmitted from the microprocessor to the noise source to alternate the coupling between the cold thermal radiation temperature and the hot thermal radiation temperature to the radiometer receiver; and
   adjusting the uncorrected output of the radiometer receiver in accordance with a series of calibration data comprising noise source radiation temperature drift, and radiometer calibration data.

13. The method in accordance with claim 12 further including the step of stabilizing the voltage output from the radiometer receiver to compensate for changes in the physical temperature of the noise source.

14. A method of determining the noise figure of a linear radiometer from a solid state noise source, comprising the steps of:

determining a noise temperature of a radiometer receiver;

determining a physical temperature of the radiometer receiver; and calculating the noise figure by dividing the physical temperature into the noise temperature and adding one in accordance with the equation $F=Tr/To+1$.

15. A solid state noise source providing a hot thermal radiation temperature and a cold thermal radiation temperature for calibration of a radiometer, said noise source comprising:

a FET microwave active noise equivalent circuit, said FET including a gate port, drain port and source port;

a feedback network coupled to the source port of the FET feedback;

an output matching network terminated to the drain port of the FET;

an input matching network connected to the gate port of the FET, said input matching network including an input port for inputting to the radiometer receiver, the hot thermal radiation temperature and the cold thermal radiation temperature; and a biasing network coupled to the output matching network and the input matching network to generate the hot thermal radiation temperature and the cold thermal radiation temperature alternately exiting at the gate port of the FET.

16. The noise source in accordance with claim 15 wherein the bias circuit further includes a processor for adjusting the DC bias to control the magnitude of the hot thermal radiation temperature and the cold thermal radiation temperature.

17. The noise source in accordance with claim 16 further comprising a stabilizing circuit coupled to the processor for compensating and controlling of the DC bias.

18. The noise source in accordance with claim 17 wherein the stabilizing circuit includes a thermistor in contact with the FET.

19. The noise source in accordance with claim 15 wherein the FET operates between 18 GHz and 40 GHz.

20. A radiometer system in accordance with claim 7 wherein the reference calibration data comprises: noise source temperature data, noise source radiation temperature drift, radiometer calibration data, and corrected radiometer calibration data.

* * * * *